US012660078B2

(12) United States Patent
Hanks et al.

(10) Patent No.: US 12,660,078 B2
(45) Date of Patent: Jun. 16, 2026

(54) TRACE DESIGN TO REDUCE THE CONNECTOR CROSSTALK

(71) Applicant: Intel Corporation, Santa Clara, CA (US)

(72) Inventors: Landon Hanks, Milwaukie, OR (US); Xiang Li, Portland, OR (US); George Vergis, Portland, OR (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/897,043

(22) Filed: Aug. 26, 2022

(65) Prior Publication Data

US 2022/0418090 A1     Dec. 29, 2022

(51) Int. Cl.
| | |
|---|---|
| *H05K 1/02* | (2006.01) |
| *H01R 12/72* | (2011.01) |
| *H01R 12/73* | (2011.01) |
| *H05K 1/11* | (2006.01) |
| *H05K 1/181* | (2026.01) |
| *H05K 3/10* | (2006.01) |

(52) U.S. Cl.
CPC ......... *H05K 1/0216* (2013.01); *H01R 12/721* (2013.01); *H01R 12/737* (2013.01); *H05K 1/111* (2013.01); *H05K 1/115* (2013.01); *H05K 1/181* (2013.01); *H05K 3/10* (2013.01); *H05K 2201/09272* (2013.01); *H05K 2201/10159* (2013.01)

(58) Field of Classification Search
None
See application file for complete search history.

(56) References Cited

U.S. PATENT DOCUMENTS

| | | | | |
|---|---|---|---|---|
| 2020/0296822 A1* | 9/2020 | Choi | ...................... | H05K 1/162 |
| 2022/0007508 A1* | 1/2022 | Stewart | ................. | H05K 1/117 |
| 2025/0374427 A1* | 12/2025 | Lee | ...................... | H05K 1/0228 |

OTHER PUBLICATIONS

Kan, Michael and Sexton, Michael Justin Allen, "Reminder: DDR4 RAM Won't Fit Into DDR5 Slots and Vice Versa", PCMag, https://www.pcmag.com/news/reminder-ddr4-ram-wont-fit-into-ddr5-slots-and-vice-versa, Oct. 15, 2021, 9 pages.
Smith, Ryan, "DDR5 Memory Specification Released: Setting the Stage for DDR5-6400 And Beyond", AnandTech, https://www.anandtech.com/show/15912/ddr5-specification-released-setting-the-stage-for-ddr56400-and-beyond, Jul. 14, 2020, 8 pages.

* cited by examiner

*Primary Examiner* — Timothy J Thompson
*Assistant Examiner* — John B Freal
(74) *Attorney, Agent, or Firm* — Compass IP Law PC

(57) ABSTRACT

Examples described herein relate to a system that includes: a circuit board comprising a plurality of layers, first and second conductive connections, first and second trace portions, first, second, and third routings, and a via wherein: the first conductive connection is coupled to the first trace portion, the second conductive connection is coupled to the second trace portion, the first routing is formed in a first layer of the plurality of layers, the second routing is formed in a second layer of the plurality of layers, the third routing is formed in the first layer of the plurality of layers, a portion of the first routing overlaps with a portion of the second routing to provide a capacitive region, and the via conductively couples a portion of the second routing overlaps with a portion of the third routing.

12 Claims, 17 Drawing Sheets

View 360

Connector pin 368

Trace 366

Routing 361

Via 362

Gold finger 364

DIMM
390

Connectors 392

Circuit board
394

View 460

Connector pin 468

Trace 466

Routing 461

Via 462-0

Via 462-1

Gold finger 464

DIMM
490

Connectors 494

Circuit board
492

900

TRACE DESIGN TO REDUCE THE CONNECTOR CROSSTALK

BACKGROUND

Volatile memory provides processor-executed applications capability to rapidly store and access data. A dual in-line memory module (DIMM) includes volatile memory devices. Connector components to the DIMM includes a memory channel interconnect. Memory channel interconnects can experience crosstalk that negatively impacts signal performance, such as for increasing data transmission rates. Signals transmitted using different signal pins can experience crosstalk whereby signals transmitted on one signal pin can cause interference to signals transmitted on one or more other signal pins. In some cases, crosstalk can be caused by capacitive, inductive, or conductive coupling.

FIG. 1 illustrates an example view of signal pins and ground pins positioned on a DIMM. Far end crosstalk (FEXT) between signals transmitted by signal traces is proportional to the difference of capacitive and inductive coupling as shown in Equation 1.

$$FEXT \propto \left( \frac{C_m}{C_{total}} - \frac{L_m}{L_{total}} \right) \qquad \text{Equation 1}$$

$C_m$ and $L_m$ are the respective mutual capacitive and inductive coupling between signal traces. A balance between capacitive and inductive coupling is an ideal case for FEXT and provides for dominant single ended DQ (data) and CA (Command/Address) signals due to signal propagation in the same direction.

FIG. 2 represents a plot of FEXT over time. In the plot, for a time span, inductive coupling dominates connector performance for one trace and gold finger. During the time span, the absolute value of FEXT increases and shifts from near-zero value. Some known approaches to reducing FEXT include increasing a number of ground pins for a connector (e.g., ground (GND) and signal pins), reducing pin length for a connector, or moving ground pin via closer to a connector interface.

DETAILED DESCRIPTION

At least to attempt to reduce cross talk among signals transmitted using signal pins, a DIMM can include capacitive pads to increase capacitance to reduce effects of inductances. In some examples, a first conductive routing line can extend from a first DIMM trace. In some examples, a second conductive routing line can extend from a second DIMM trace. The first conductive routing line can include multiple layers of conductive routing lines and the multiple layers can be separated by dielectric or insulator material. The second conductive routing line can include multiple layers of conductive routing lines and the multiple layers can be separated by dielectric or insulator material. In some examples, a layer of the first conductive routing line can be connected to the first DIMM trace using a via. In some examples, a layer of the second conductive routing line can be connected to the second DIMM trace using a via.

The first conductive routing line can include a layer and region that overlaps with a portion of a layer and region of the second conductive routing line and potentially forms capacitive charge based on a flow of current through a trace, as described herein. In some examples, the first conductive routing line extends in a linear shape towards the second conductive routing line and the second conductive routing line extends in a linear shape towards the first conductive routing line. In some examples, the first conductive routing line extends in a curved or semi-circular shape towards the second conductive routing line and the second conductive routing line extends in a curved shape or semi-circular towards the first conductive routing line.

Examples described herein can at least improve single-ended (SE) signaling performance of Joint Electronic Device Engineering Council Double Data Rate version 5 (DDR5) unregistered (U), registered (R), load reduce (LR) dual in-line memory module (DIMM) connectors, increasing capacitive coupling between signals near golden fingers can help to reduce FEXT.

Figure 1:
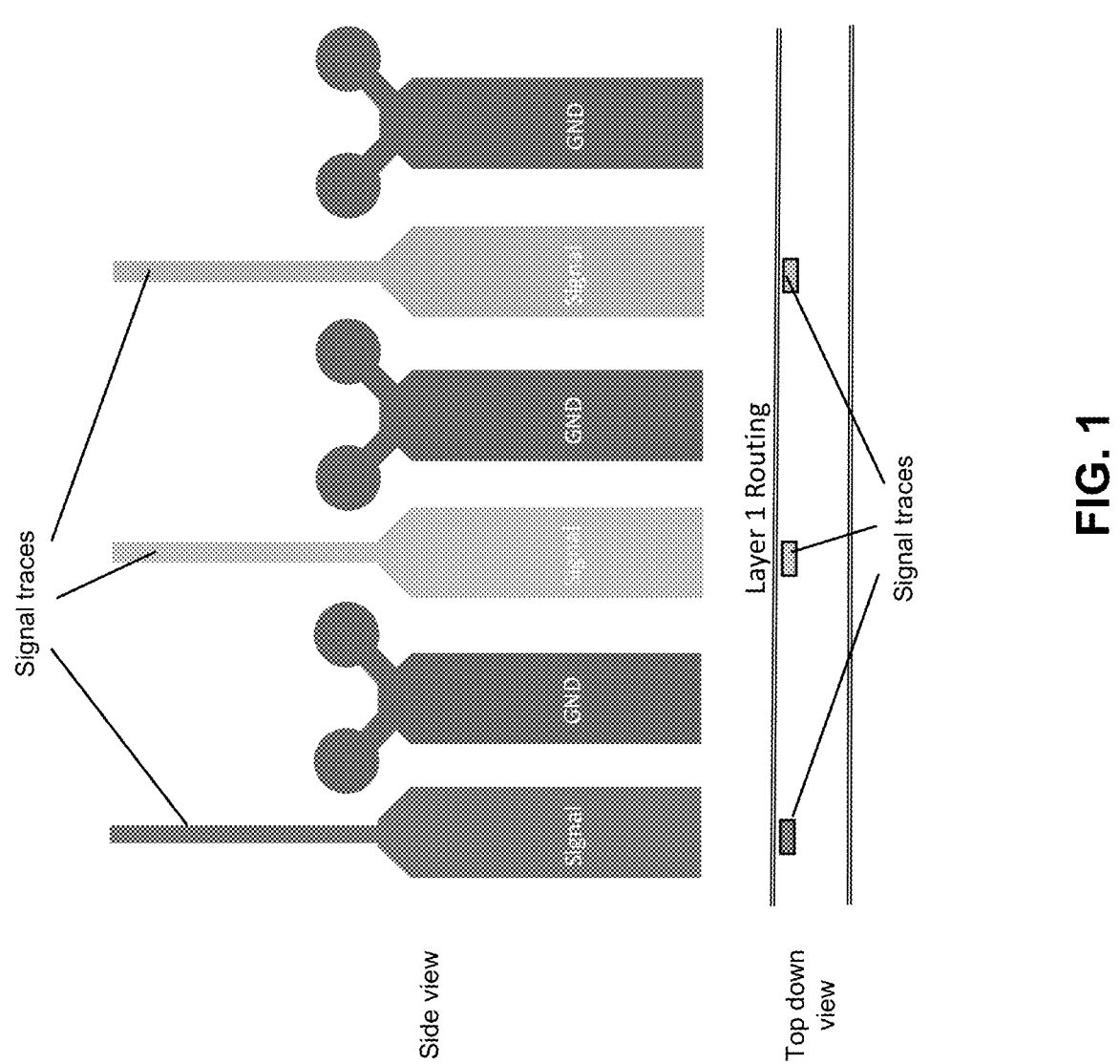
FIG. 1 illustrates an example view of signal pins and ground pins positioned on a DIMM.
Figure 2:
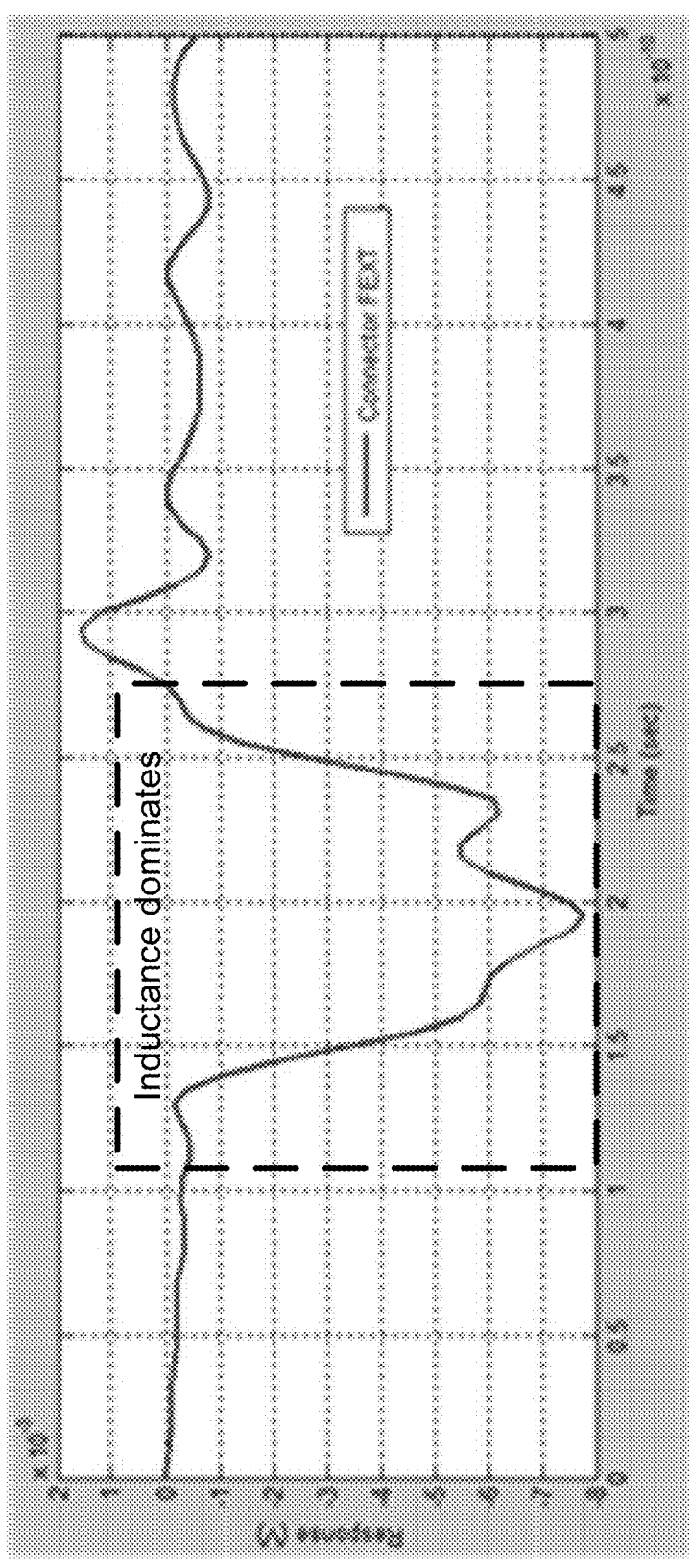
FIG. 2 represents a plot of FEXT over time.
Figure 3A:
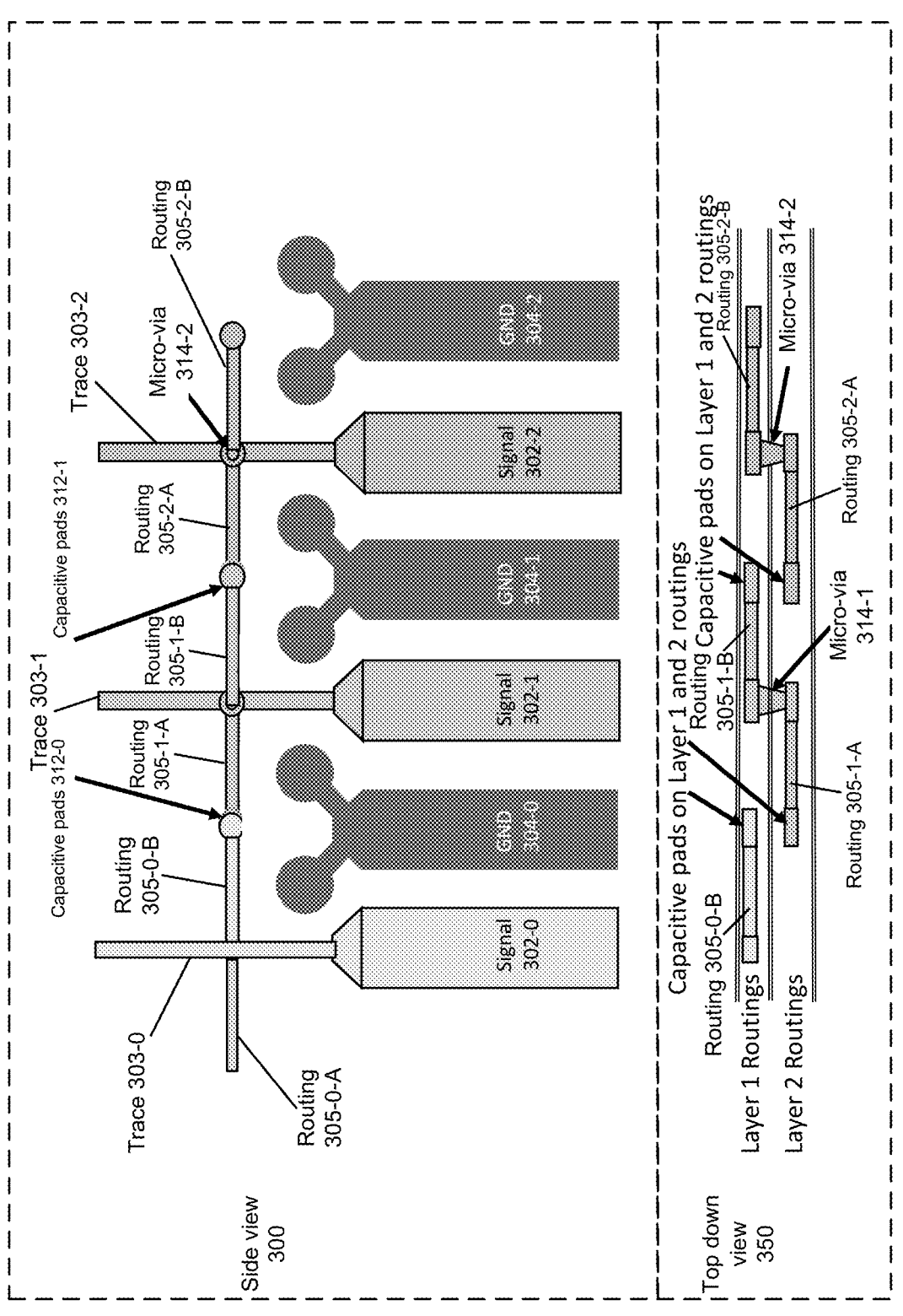
FIG. 3A depicts views of signal and ground pins of a DIMM.

FIG. 3A depicts views of signal and ground pins of a DIMM. Side view 300 depicts signal pins 302-0 to 302-2 are interspersed among respective ground (GND) pins 304-0 to 304-2. Trace 303-0 can be conductively coupled to signal pin 302-0 and to routing 305-0-A and to routing 305-0-B. Routing 305-0-A can extend at a 90 degree angle from trace 303-0 or in a linear direction. Routing 305-0-B can extend at a 90 degree angle from trace 303-0 towards trace 303-1 or in a linear direction. Trace 303-1 can be conductively coupled to signal pin 302-1 and to routing 305-1-A and to routing 305-1-B. Routing 305-1-A can extend at a 90 degree angle or in a linear direction from trace 303-1. Routing 305-1-B can extend at a 90 degree angle or in a linear direction from trace 303-1 towards trace 303-2. Trace 303-2 can be conductively coupled to signal pin 302-2 and to routing 305-2-A and to routing 305-2-B. Routing 305-2-A can extend at a 90 degree angle or in a linear direction from trace 303-2. Routing 305-2-B can extend at a 90 degree angle or in a linear direction from trace 303-2. Current flow through signal pin 302-1 can cause capacitance to form between the capacitive pads on both capacitor pads of routings 305-0-B and 305-1-A and routings 305-1-B and 305-2-A.

Traces 303-0 to 303-2 can be conductively coupled to a series resistor (not shown) or transistor (not shown) in order to connect a signal path.

Top down view 350 shows that routings can be positioned in different layers of a circuit board. For example, routings 305-0-A, 305-1-A, and 305-2-A and portions of via 314-1 and via 314-2 can be positioned in layer 2 of the circuit board, whereas routings 305-0-B, 305-1-B, and 305-2-B and portions of via 314-1 and via 314-2 can be positioned in layer 1 of the circuit board. For example, layer 1 can include routings 305-0-B, 305-1-B, and 305-2-B formed among dielectric material as well as portions of via 314-1 and via 314-2. For example, layer 2 can include routings 305-0-A, 305-1-A, and 305-2-A as well as portions of via 314-1 and via 314-2 formed among dielectric material. Via 314-1 can conductively connect capacitive pad to associated signal traces. Similarly, via 314-2 can conductively connect capacitive pad to associated signal traces. For example, via 314-1 can conductively couple routing 305-1-A to routing 305-1-B. Similarly, via 314-1 can conductively couple routing 305-2-A to routing 305-2-B.

As shown in top down view 350, traces 303-0 to 303-2 can be formed in multiple layers, layer 1 and layer 2. For example, in layer 1, routing 305-0-B can be coupled to trace 303-0. Similarly, in a second portion of layer 1, routing 305-1-B can be coupled to trace 303-1 and routing 305-1-A using via 314-1. In a third portion of layer 1, routing 305-2-B can be coupled to trace 303-2 and routing 305-2-A using via 314-2. In some examples, in layer 2, routing 305-1-A can be coupled to trace 303-1 by direct connection or using via 314-1. Similarly, in a second portion of layer 2, routing 305-2-A can be coupled to trace 303-2 by direct connection or using via 314-2.

A region of routing 305-0-B (e.g., a capacitive pad of capacitive pads 312-0) can be positioned opposite a region on routing 305-1-A (e.g., a capacitive pad of capacitive pads 312-0). A capacitive pad can be circular shape, square, rectangular, and can be flush or raised from routing 305-0-B. A capacitive pad can be circular shape, square, rectangular, and can be flush or raised from routing 305-1-A. Capacitance can be formed between capacitive pads of routing 305-0-B and routing 305-1-A by current flow or voltage. Current flow or voltage from signal transmitted though respective signal paths can create an electric field between capacitive pads which gives rise to capacitance. Capacitance can be controlled to not contribute to FEXT by different stack-ups, e.g., adjusting distances between layers and/or using different capacitive pad dimensions. The capacitance can offset inductance and reduce FEXT, according to Equation (1).

In some examples, layer 1 and layer 2 can be a single layer. In some examples, layer 1 and layer 2 can be formed as different layers and layer 1 and layer 2 can be bonded together. For example, a glue, epoxy, or other bonding technique can be used to mount, affix, or connect layer 1 to layer 2 with alignment of capacitive pads of layer 1 and layer 2 routings and providing conductive connection between different portions of vias 314-1 in layer 1 and layer 2 as well as providing conductive connection between different portions of vias 314-2 in layer 1 and layer 2.

Traces 303-0, 303-1, and 303-2 can be formed of one or more of: copper, bronze, or an alloy. Routings 305-0-A, 305-0-B, 305-1-A, 305-1-B, 305-2-A, and 305-2-B can be formed of one or more of: copper, bronze, or an alloy. Vias 314-1 and 314-2 can be formed of one or more of: copper, bronze, or an alloy.

As described herein, signal pins 302-0, 302-1, and 302-2 and ground pins 304-0, 304-1, and 304-2 can be positioned in a circuit board of a DIMM. Note that the side view 300 can apply to one or both of opposite sides of a DIMM circuit board. Signal pins 302-0, 302-1, and 302-2 and ground pins 304-0, 304-1, and 304-2 can be coupled to gold fingers or include gold fingers to be conductively coupled to pins of a circuit board as described herein.

Figure 3B:
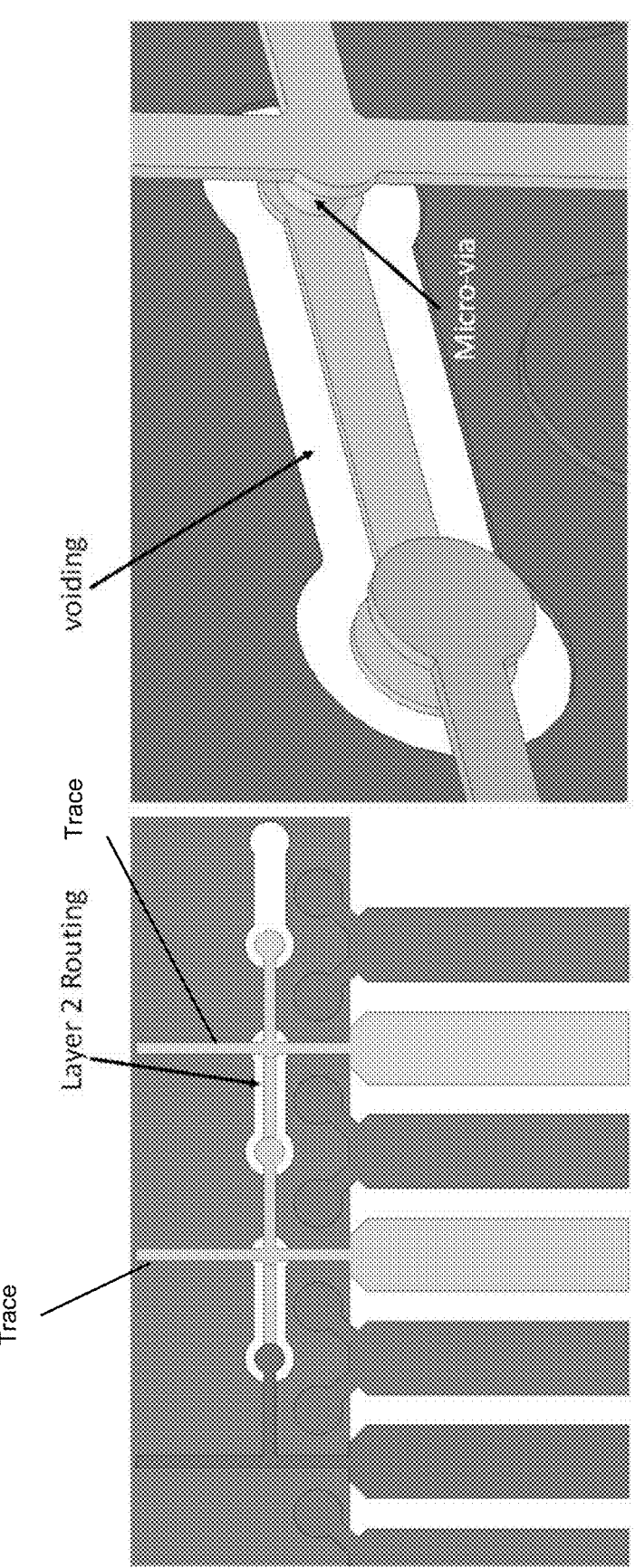
FIG. 3B depicts an example perspective of routings, traces, micro-vias, and voids in a circuit board.

FIG. 3B depicts an example perspective of routings, traces, micro-vias, and voids in a circuit board. For example, voids can represent a space with no material present and that surrounds a conductive via, routing, and/or trace. A void can be surrounded by dielectric material.

Figure 3C:
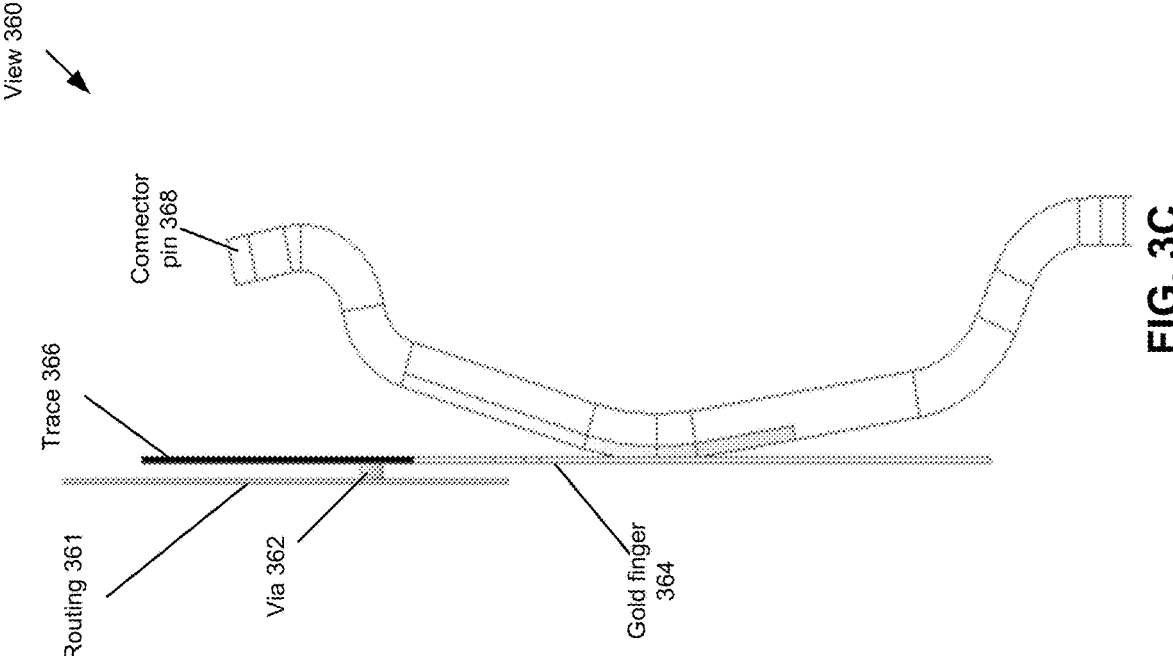
FIG. 3C depicts an example perspective of connector pin to gold finger connection.

FIG. 3C depicts an example perspective of connector pin to gold finger connection. As shown in view 360, gold finger 364 of a signal pin is conductively coupled to connector pin 368 from a circuit board. Trace 366 extends from gold finger 364 and is coupled using via 362 to routing 361.

Figure 3D:
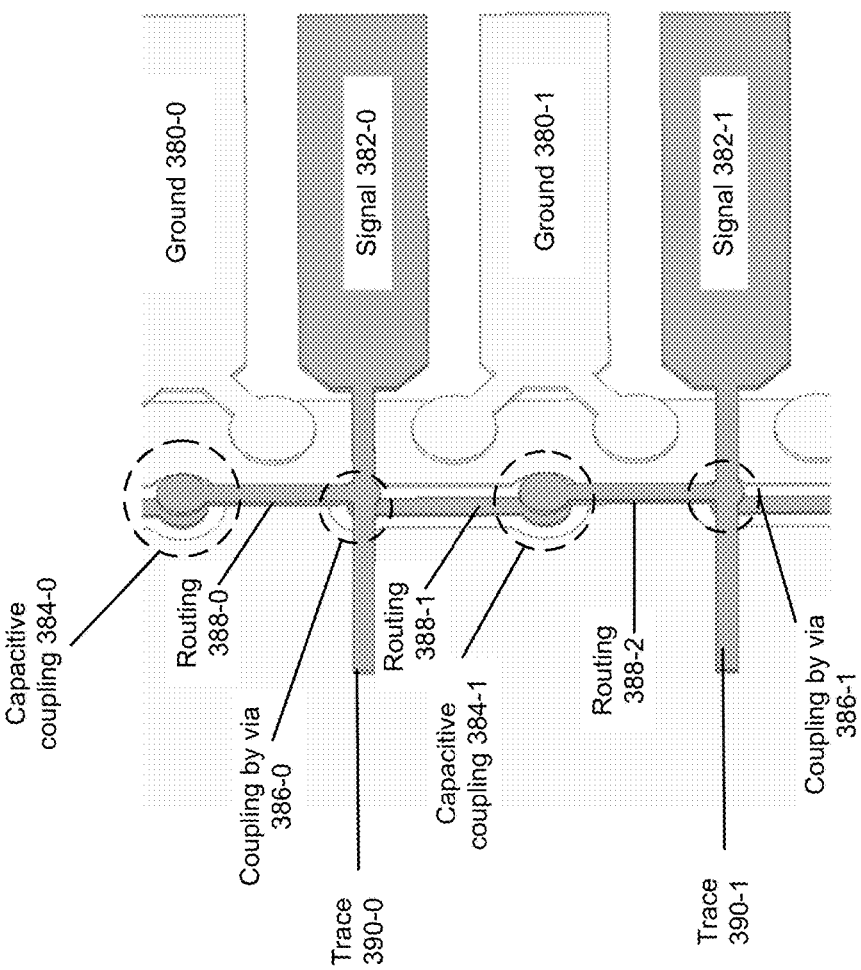
FIG. 3D depicts an example of connections of routings.

FIG. 3D depicts an example of connections of routings. As shown, routing 388-0 can be connected by a via 386 to routing 388-1 and routing 388-0 can be connected to trace 390-0. A capacitive coupling 384-1 can be formed between a surface or pad of routing 388-1 and a surface or pad of routing 388-2.

Figure 3E:
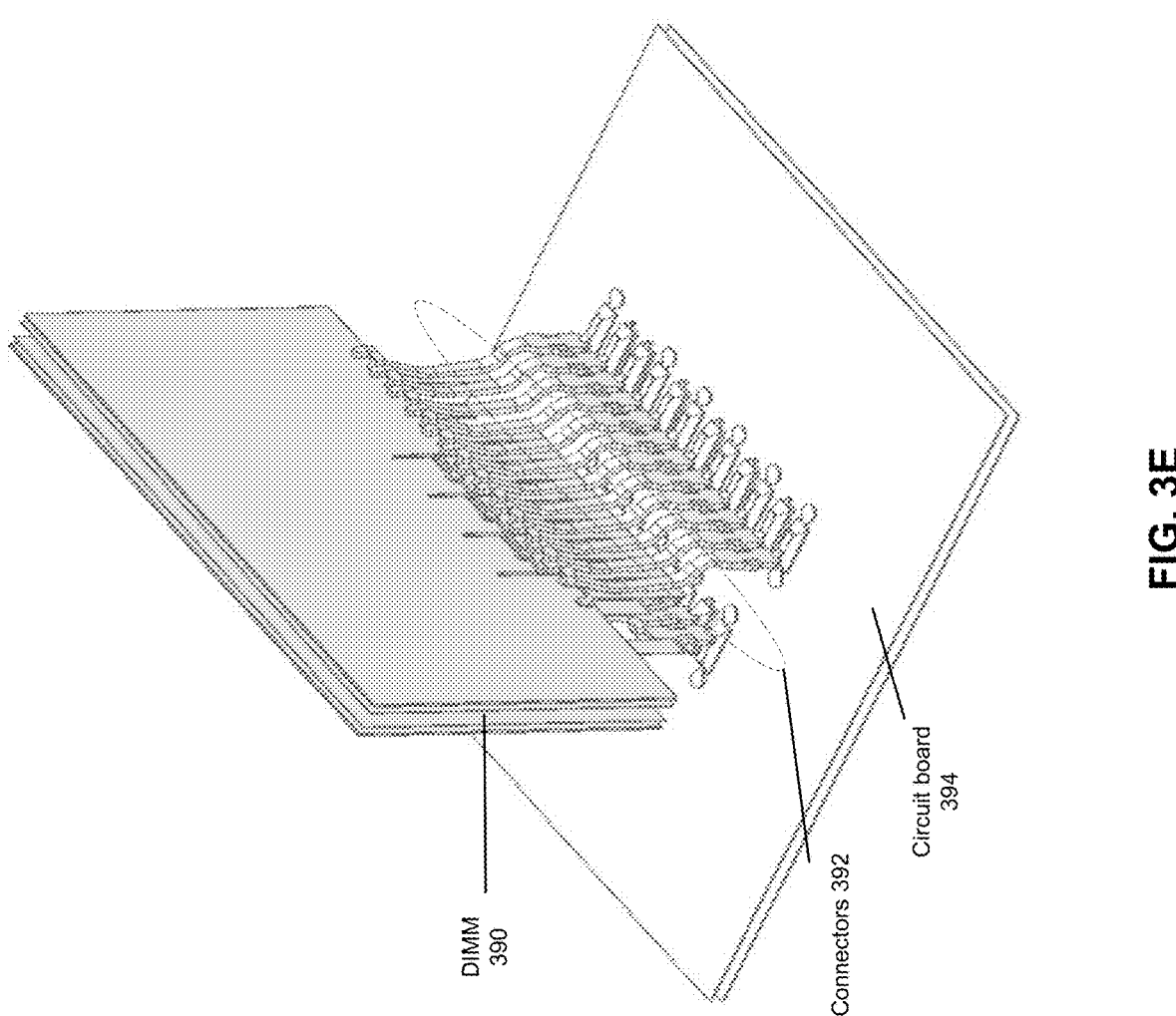
FIG. 3E depicts an example of gold fingers of a DIMM connected to connectors of a circuit board.

FIG. 3E depicts an example of gold fingers of a DIMM 390 connected to connectors 392 of circuit board 394.

A routing can provide a branch from a transmission signal line. In some cases, a stub effect can occur from the branch that gives rise to a resonance at frequencies (e.g., harmonics) that can attenuate (e.g., negatively impact) a signal through propagating a signal line. Various examples herein can potentially reduce stub effect.

Figure 4A:
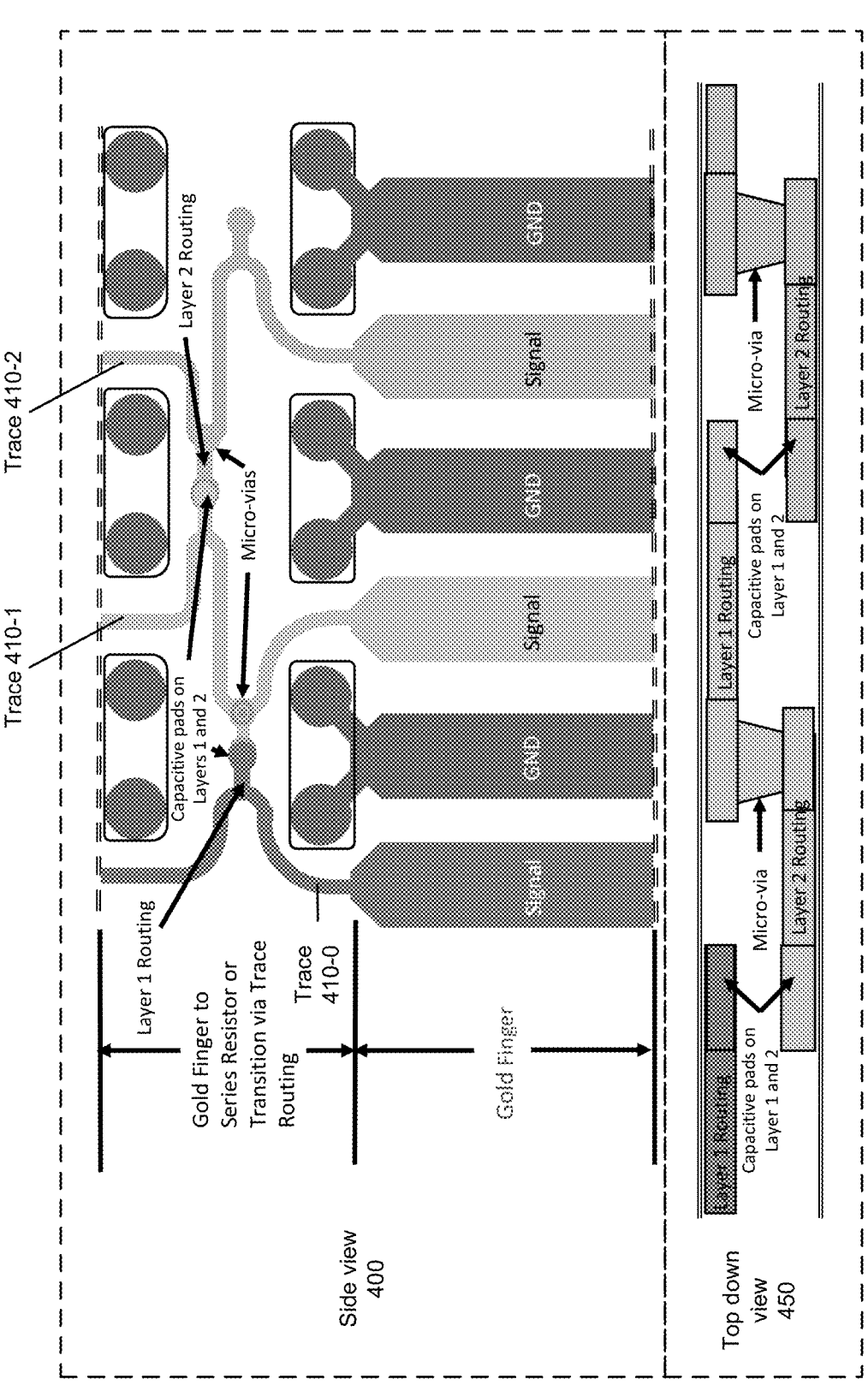
FIG. 4A depicts an example of use curved or semi-circular trace shapes.

Use of trace shapes without right angles and that are curved can reduce stub effect. FIG. 4A depicts an example of use curved or semi-circular trace shapes. For example, trace 410-0, trace 410-1, and trace 410-2 can be curved or semi-circular shapes. Surfaces or pads of trace 410-0 and trace 410-1 can overlap as shown in top down view 450 and provide a capacitive contribution to Equation (1). Trace 410-1 and trace 410-2 can be conductively coupled using a via.

Note that the side view 400 can apply to one or both of opposite sides of a DIMM circuit board.

Figure 4B:
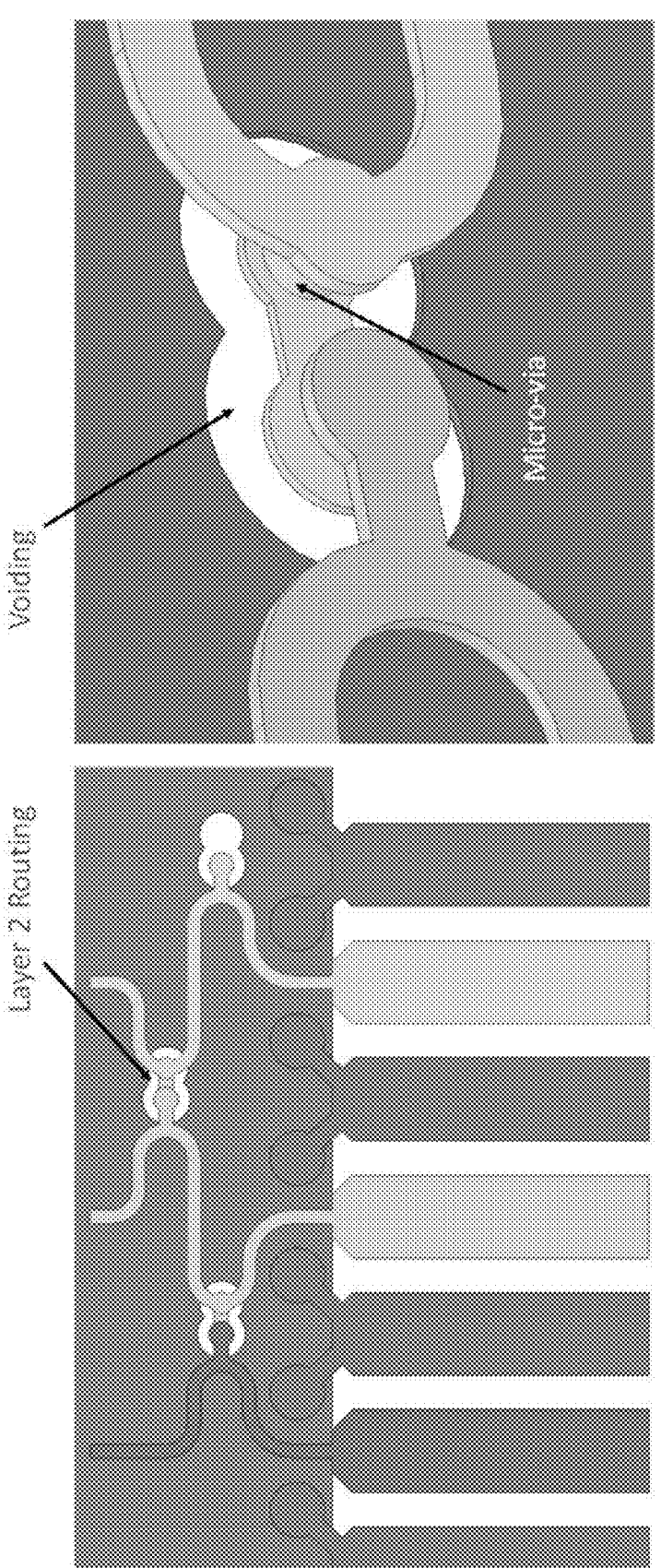
FIG. 4B depicts an example perspective of curved routings, traces, micro-vias, and voids in a circuit board.

FIG. 4B depicts an example perspective of curved routings, traces, micro-vias, and voids in a circuit board. For example, voids can represent a space with no material present and that surrounds a conductive via, routing, and/or trace. A void can be surrounded by dielectric material.

Figure 4C:
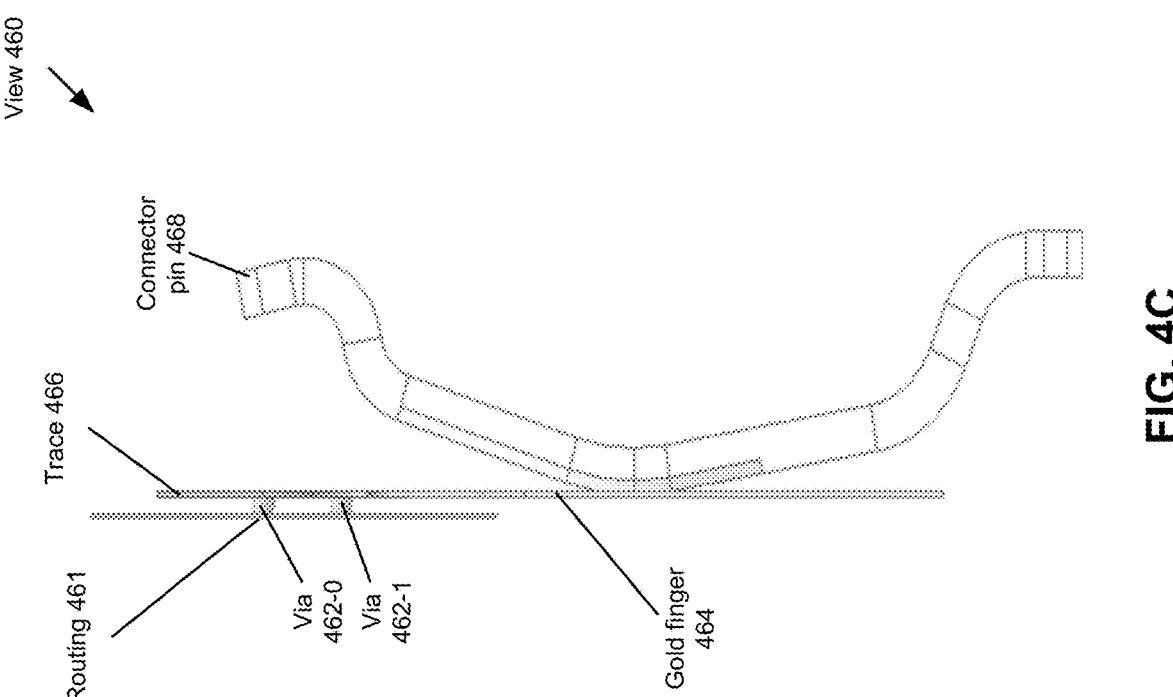
FIG. 4C depicts an example perspective of connector pin to gold finger connection.

FIG. 4C depicts an example perspective of connector pin to gold finger connection. As shown in view 460, gold finger 464 of a signal pin is conductively coupled to connector pin 468 from a circuit board. Trace 466 extends from gold finger 364 and is coupled using via 462-0 to routing 461. Via 462-1 couples two routings together.

Figure 4D:
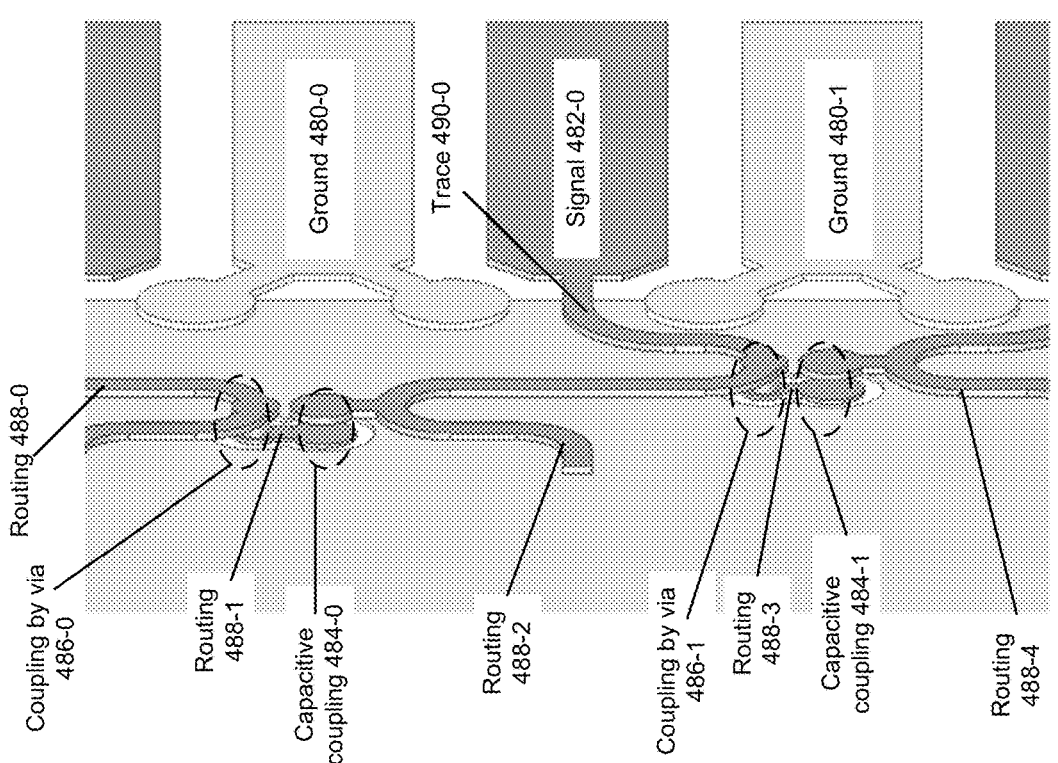
FIG. 4D depicts an example of connections of routings.

FIG. 4D depicts an example of connections of routings. As shown, routing 488-0 can be connected by a via 486-0 to routing 488-1. A capacitive coupling 484-0 can be formed between a surface or pad of routing 488-1 and a surface or pad of routing 488-2. Similarly, routing 488-2 can be connected by a via 486-1 to routing 488-3. A capacitive coupling 484-1 can be formed between a surface or pad of routing 488-3 and a surface or pad of routing 488-4.

Figure 4E:
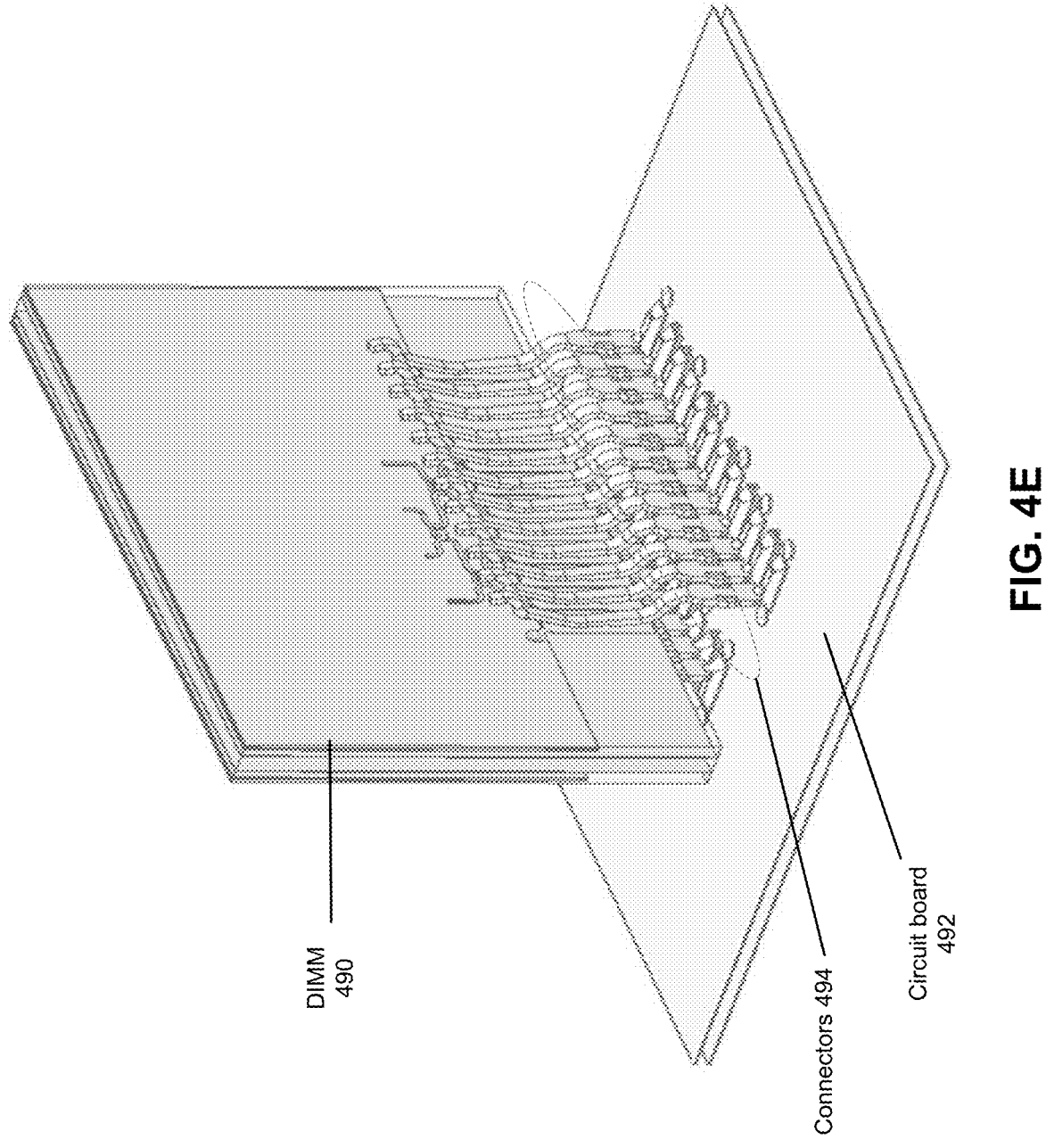
FIG. 4E depicts an example of gold fingers of a DIMM connected to connectors of a circuit board.

FIG. 4E depicts an example of gold fingers of a DIMM 490 with curved routings connected to connectors 492 of circuit board 494.

Figure 5:
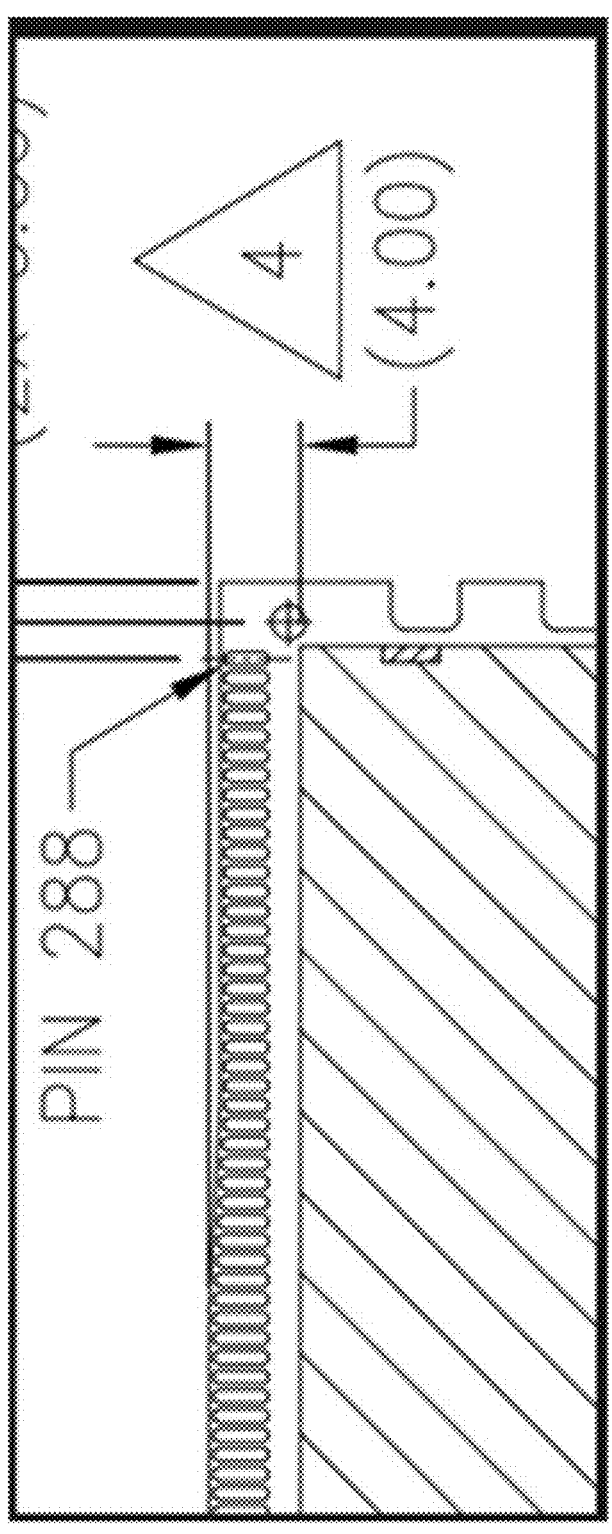
FIG. 5 depicts an example of dimensions of a portion a DIMM.

FIG. 5 depicts an example of a DIMM with 4 mm length of a keep-out region for components in a DDR5 pin layout. In some examples, a combined length of signal pin (gold finger), trace, and routing can be at or less than 4 mm. Voiding can be provided in a ground and/or power plane around trace pin connections around vias and capacitive coupling in order avoid shorting signal to ground.

Figure 6:
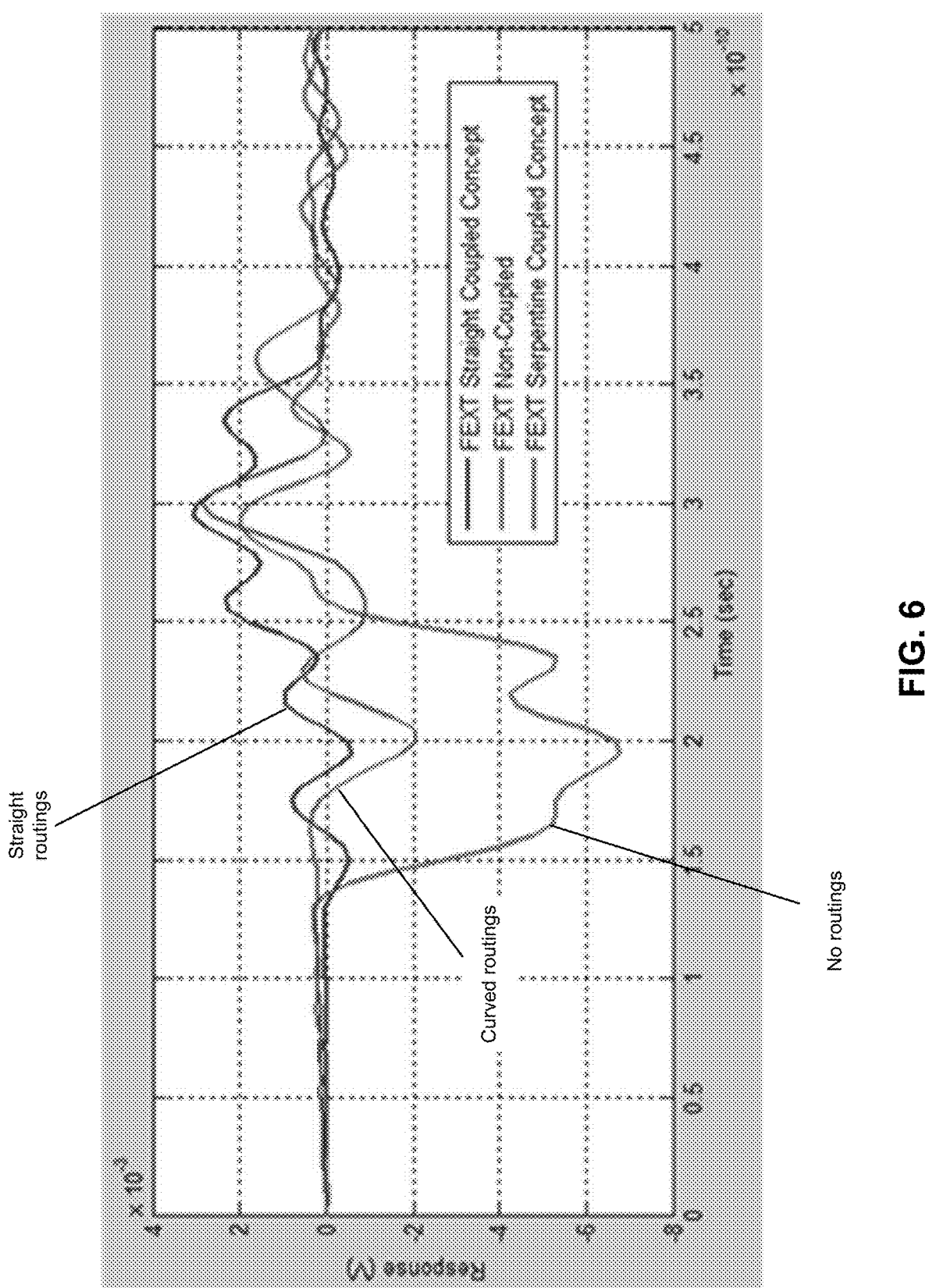
FIG. 6 depicts an example of comparisons of FEXT for various designs.

FIG. 6 depicts an example of comparisons of FEXT for various designs. As shown, the non-coupled design uses no routing and can experience increased FEXT due to increased inductance. The design with straight routings and curved or serpentine shaped routings can exhibit reduced FEXT compared to the non-coupled design uses no routing.

Figure 7:
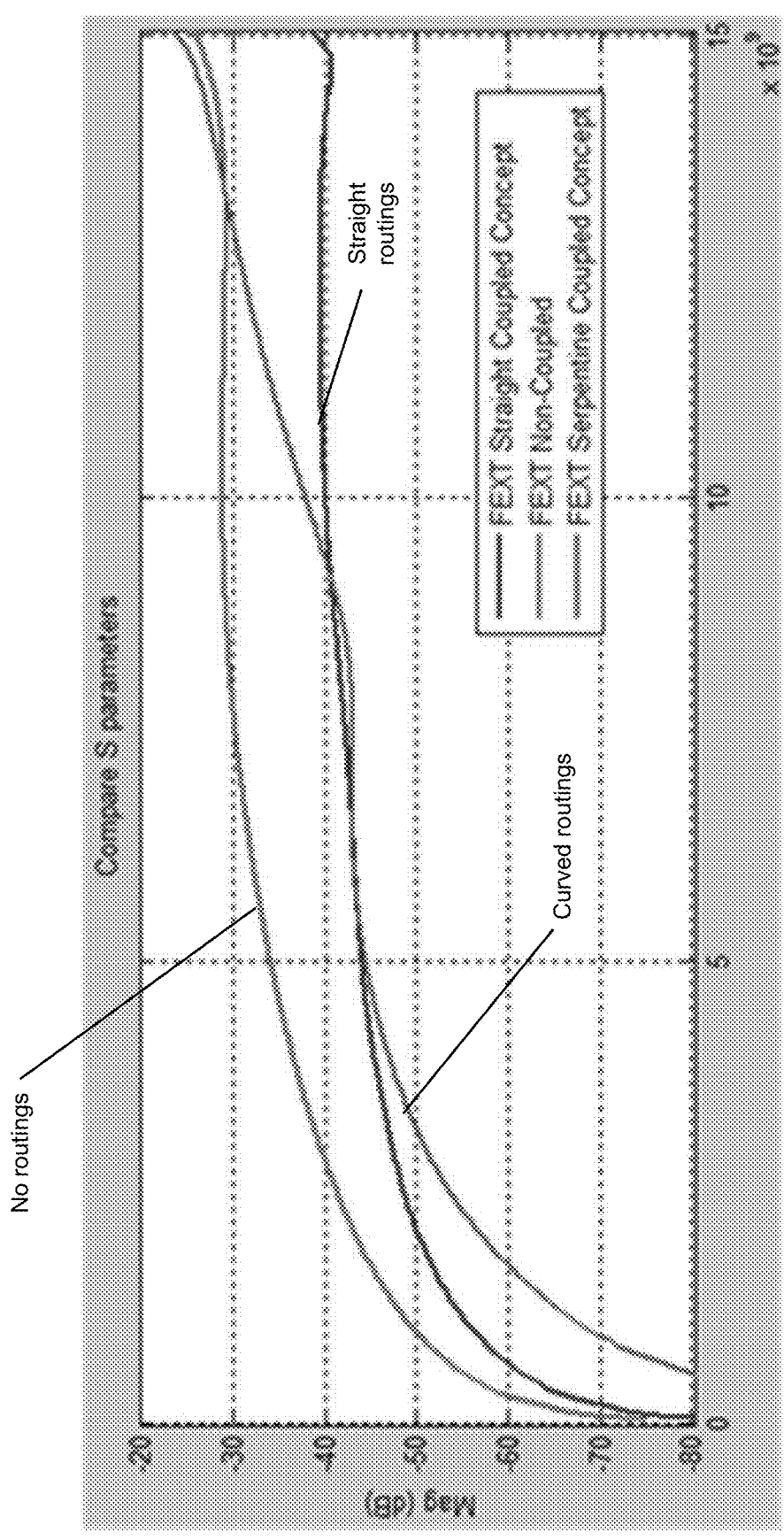
FIG. 7 depicts an example of a circuit board with routing coupled to a second circuit board.

FIG. 7 depicts frequency domain representation of crosstalk. S-parameter can represent a scattering parameter that describes an input-output relationships between ports in an electrical system. S-parameter can provide a frequency domain representation of crosstalk.

Figure 8:
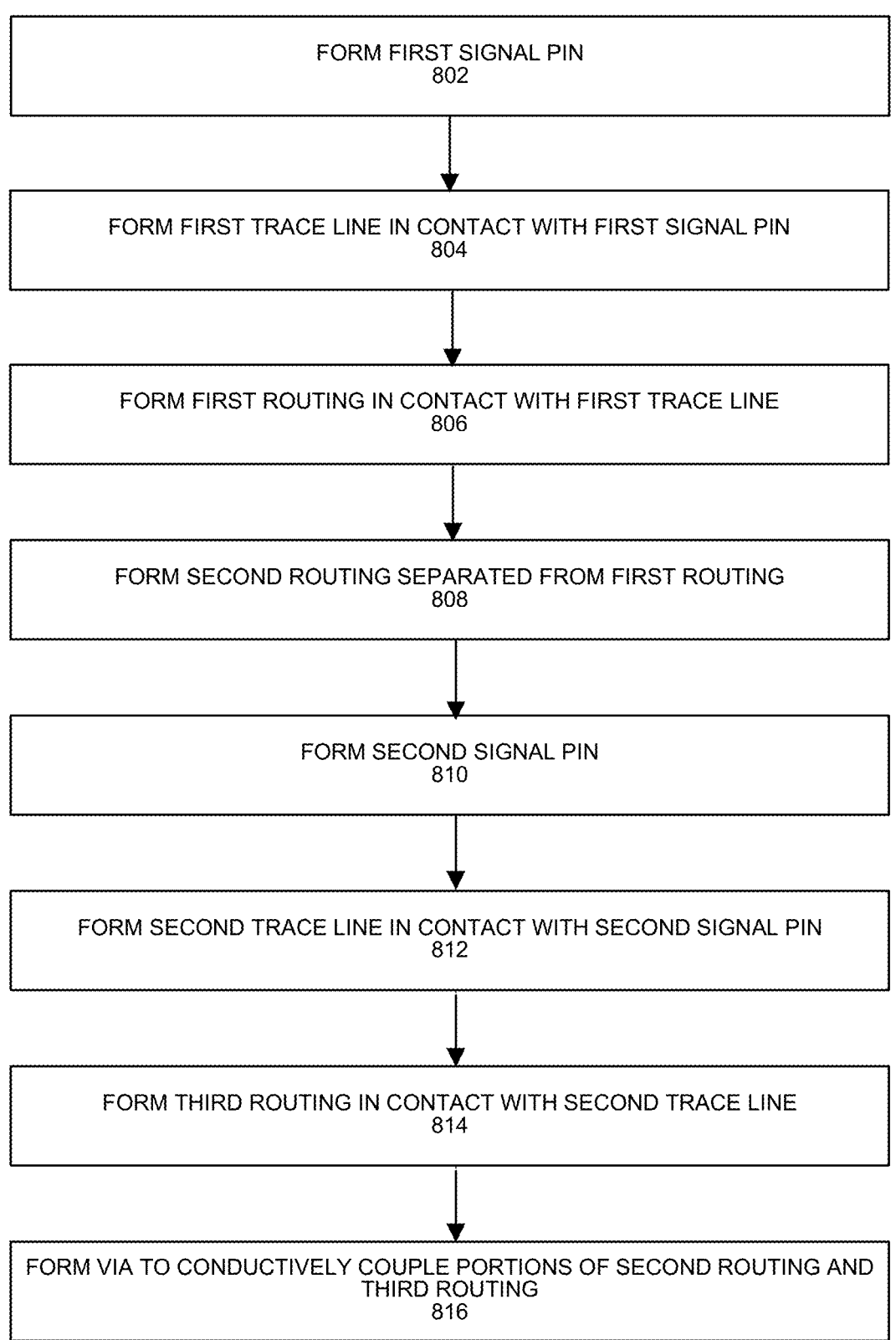
FIG. 8 depicts an example process.

FIG. 8 depicts an example process to form a circuit board with circuitry to attempt to reduce FEXT arising from inductance. At 802, a first signal pin can be formed in a circuit board. At 804, a first trace line can be formed in a circuit board to contact with the first signal pin. At 806, a first routing can be formed in the circuit board in contact with the first trace line. At 808, a second routing can be formed in the circuit board so that a portion of the first routing is separated from a portion of the second routing by a dielectric material and is capable of the portion of the first routing and the portion of the second routing forming a capacitor.

At 810, a second signal pin can be formed in a circuit board. At 812, a second trace line can be formed in a circuit board to contact with the second signal pin. At 814, a third routing can be formed in the circuit board in contact with the second trace line. At 816, a via can be formed in the circuit board to provide a conductive coupling between a portion of the second routing and a portion of the third routing. In some examples, providing current through the second signal pin can cause a capacitance to form in the capacitor that can offset inductance and reduce FEXT.

Figure 9:
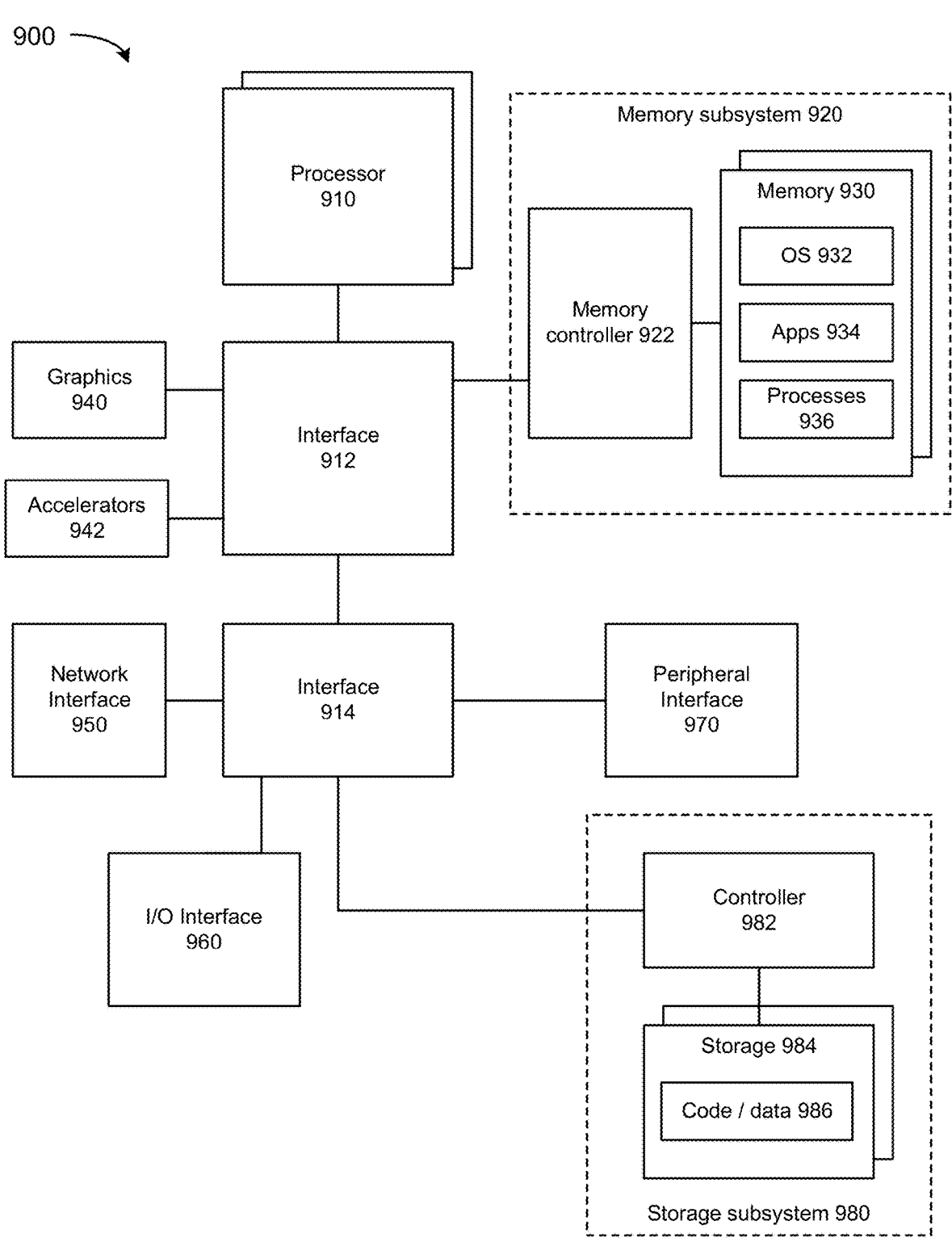
FIG. 9 depicts a system.

FIG. 9 depicts an example system. The system can use embodiments described herein to form a circuit board with routing circuit to reduce FEXT. System 900 includes processor 910, which provides processing, operation management, and execution of instructions for system 900. Processor 910 can include any type of microprocessor, central processing unit (CPU), graphics processing unit (GPU), XPU, processing core, or other processing hardware to provide processing for system 900, or a combination of processors. An XPU can include one or more of: a CPU, a graphics processing unit (GPU), general purpose GPU (GPGPU), and/or other processing units (e.g., accelerators or programmable or fixed function FPGAs). Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components

940, or accelerators 942. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Accelerators 942 can be a programmable or fixed function offload engine that can be accessed or used by a processor 910. For example, an accelerator among accelerators 942 can provide compression (DC) capability, cryptography services such as public key encryption (PKE), cipher, hash/authentication capabilities, decryption, or other capabilities or services. In some embodiments, in addition or alternatively, an accelerator among accelerators 942 provides field select controller capabilities as described herein. In some cases, accelerators 942 can be integrated into a CPU socket (e.g., a connector to a motherboard or circuit board that includes a CPU and provides an electrical interface with the CPU). For example, accelerators 942 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 942 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 900 includes interface 914, which can be coupled to interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can transmit data to a device that is in the same data center or rack or a remote device, which can include sending data stored in memory. Network interface 950 can receive data from a remote device, which can include storing received data into memory. Various embodiments can be used in connection with network interface 950, processor 910, and memory subsystem 920.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (e.g., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (e.g., the value or state of the data is indeterminate if power is interrupted to system 900). In one example, storage subsystem 980 includes controller 982 to interface with storage 984. In one example controller 982 is a physical part of interface 914 or processor 910 or can include circuits or logic in both processor 910 and interface 914.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). Another example of volatile memory includes cache or static random access memory (SRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In some embodiments, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 900. More specifically, power source typically interfaces to one or multiple power supplies in system 900 to provide power to the components of system 900. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 900 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," or "logic." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Flow diagrams as illustrated herein provide examples of sequences of various process actions. The flow diagrams can indicate operations to be executed by a software or firmware routine, as well as physical operations. In some embodiments, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, and so forth.

Example 1 includes one or more examples, and includes an apparatus comprising: a circuit board comprising a plurality of layers, first and second conductive connections, first and second trace portions, first, second, and third routings, and a via wherein: the first conductive connection is coupled to the first trace portion, the second conductive connection is coupled to the second trace portion, the first routing is formed in a first layer of the plurality of layers, the second routing is formed in a second layer of the plurality of layers, the third routing is formed in the first layer of the plurality of layers, a portion of the first routing overlaps with a portion of the second routing to provide a capacitive region, and the via conductively couples a portion of the second routing overlaps with a portion of the third routing.

Example 2 includes one or more examples, wherein the second routing extends at a 90 degree angle from the first trace portion.

Example 3 includes one or more examples, wherein the third routing extends at a 90 degree angle from the second trace portion.

Example 4 includes one or more examples, and includes a capacitive pad coupled to the portion of the first routing that overlaps with the portion of the second routing to provide a capacitive region and a capacitive pad coupled to the portion of the portion of the second routing that overlaps with the portion of the first routing.

Example 5 includes one or more examples, and includes a ground pin positioned in the circuit board between the first and second conductive connections.

Example 6 includes one or more examples, wherein the second routing extends in a semi-circular shape from the first trace portion.

Example 7 includes one or more examples, wherein the third routing extends at a semi-circular shape from the second trace portion.

Example 8 includes one or more examples, and includes at least one memory device coupled to the first and second conductive connections.

Example 9 includes one or more examples, wherein the first, second, and third routings comprise one or more of: copper, bronze, or an alloy.

Example 10 includes one or more examples, and includes a dual inline memory module (DIMM), wherein the DIMM comprises the circuit board.

Example 11 includes one or more examples, wherein an arrangement of the first and second conductive connections is consistent with Joint Electronic Device Engineering Council Double Data Rate version 5 (DDR5).

Example 12 includes one or more examples, and includes a first device coupled to the circuit board, wherein the first device comprises a surface mounted (SMT) connector of a motherboard, a motherboard, and one or more of: central processing unit (CPU), XPU, accelerator, and/or graphics processing unit (GPU).

Example 13 includes one or more examples, and includes a method comprising: forming a first signal pin; forming a first trace line in contact with the first signal pin; forming a first routing in contact with the first trace line; forming a second routing, wherein a portion of the first routing is separated from a portion of the second routing by a dielectric material and is capable of the portion of the first routing and the portion of the second routing form a capacitor; forming a second signal pin; forming a second trace line in contact with the second signal pin; forming a third routing in contact with the second trace line; and forming a via to provide a conductive coupling between a portion of the second routing and a portion of the third routing.

Example 14 includes one or more examples, and includes forming a ground pin between the first signal pin and the second signal pin.

Example 15 includes one or more examples, wherein the first routing extends linearly from the first trace line and the second routing extends linearly from the second trace line.

Example 16 includes one or more examples, wherein the first routing extends in a curved shape from the first trace line and the second routing extends in a curved shape from the second trace line.

Example 17 includes one or more examples, wherein the first routing comprises one or more of: copper, bronze, or an alloy and the second routing comprises one or more of: copper, bronze, or an alloy.

Example 18 includes one or more examples, wherein based on current flow through the second trace line, capacitance is formed in the capacitor.

Example 19 includes one or more examples, wherein an arrangement of the first signal pin, the first trace line, the first routing, the second routing, the second signal pin, the second trace line, and the third routing is consistent with Joint Electronic Device Engineering Council Double Data Rate version 5 (DDR5).

Example 20 includes one or more examples, and includes forming the first signal pin, the first trace line, the first routing, the second routing, the second signal pin, the second trace line, and the third routing in a circuit board of a dual inline memory module (DIMM).

What is claimed is:

1. An apparatus comprising:
a circuit board comprising a plurality of layers, first and second conductive connections, first and second trace portions, first, second, and third routings, and a via wherein:
  the first conductive connection is coupled to the first trace portion,
  the second conductive connection is coupled to the second trace portion,
  the first routing is formed in a first layer of the plurality of layers,
  the second routing is formed in a second layer of the plurality of layers,
  the third routing is formed in the first layer of the plurality of layers,
  a portion of the first routing overlaps with a portion of the second routing to provide a capacitive region, and
  the via conductively couples a portion of the second routing that overlaps with a portion of the third routing.

2. The apparatus of claim 1, wherein the second routing extends at a 90 degree angle from the first trace portion.

3. The apparatus of claim 1, wherein the third routing extends at a 90 degree angle from the second trace portion.

4. The apparatus of claim 1, comprising:
  a capacitive pad coupled to the portion of the first routing that overlaps with the portion of the second routing to provide a capacitive region and
  a capacitive pad coupled to the portion of the second routing that overlaps with the portion of the first routing.

5. The apparatus of claim 1, comprising a ground pin positioned in the circuit board between the first and second conductive connections.

6. The apparatus of claim 1, wherein the second routing extends in a semi-circular shape from the first trace portion.

7. The apparatus of claim 1, wherein the third routing extends at a semi-circular shape from the second trace portion.

8. The apparatus of claim 1, comprising at least one memory device coupled to the first and second conductive connections.

9. The apparatus of claim 1, wherein the first, second, and third routings comprise one or more of: copper, bronze, or an alloy.

10. The apparatus of claim 1, comprising a dual inline memory module (DIMM), wherein the DIMM comprises the circuit board.

11. The apparatus of claim 10, wherein an arrangement of the first and second conductive connections is consistent with Joint Electronic Device Engineering Council Double Data Rate version 5 (DDR5).

12. The apparatus of claim 1, further comprising a first device coupled to the circuit board, wherein
  the first device comprises a surface mounted (SMT) connector of a motherboard, a motherboard, and one or more of: central processing unit (CPU), XPU, accelerator, and/or graphics processing unit (GPU).

* * * * *